(12) United States Patent
Kumar

(10) Patent No.: US 7,706,169 B2
(45) Date of Patent: Apr. 27, 2010

(54) LARGE CAPACITY ONE-TIME PROGRAMMABLE MEMORY CELL USING METAL OXIDES

(75) Inventor: Tanmay Kumar, Pleasanton, CA (US)

(73) Assignee: SanDisk 3D LLC, Milpitas, CA (US)

( * ) Notice: Subject to any disclaimer, the term of this patent is extended or adjusted under 35 U.S.C. 154(b) by 189 days.

(21) Appl. No.: 12/005,277

(22) Filed: Dec. 27, 2007

(65) Prior Publication Data
US 2009/0168486 A1    Jul. 2, 2009

(51) Int. Cl.
G11C 11/00    (2006.01)
(52) U.S. Cl. .................... 365/148; 365/100; 365/175
(58) Field of Classification Search ............... 365/100, 365/148, 115, 175, 243
See application file for complete search history.

(56) References Cited

U.S. PATENT DOCUMENTS

| | | | |
|---|---|---|---|
| 5,915,167 | A | 6/1999 | Leedy |
| 6,055,180 | A | 4/2000 | Gudesen et al. |
| 6,834,008 | B2 | 12/2004 | Rinerson et al. |
| 6,847,544 | B1 | 1/2005 | Smith et al. |
| 6,873,543 | B2 | 3/2005 | Smith et al. |
| 6,999,366 | B2 | 2/2006 | Perner et al. |
| 7,071,008 | B2 | 7/2006 | Rinerson et al. |
| 7,081,377 | B2 | 7/2006 | Cleeves |
| 7,176,064 | B2 | 2/2007 | Herner |
| 7,224,013 | B2 | 5/2007 | Herner et al. |
| 2004/0245557 | A1 | 12/2004 | Seo et al. |
| 2005/0226067 | A1 | 10/2005 | Herner et al. |
| 2006/0250836 | A1 | 11/2006 | Herner et al. |
| 2006/0250837 | A1 | 11/2006 | Herner et al. |
| 2006/0273298 | A1 | 12/2006 | Petti |
| 2007/0069276 | A1 | 3/2007 | Scheuerlein et al. |
| 2007/0072360 | A1 | 3/2007 | Kumar et al. |
| 2007/0090425 | A1 | 4/2007 | Kumar et al. |
| 2007/0114509 | A1 | 5/2007 | Herner |
| 2008/0007989 | A1 * | 1/2008 | Kumar et al. ............... 365/148 |
| 2008/0013364 | A1 * | 1/2008 | Kumar et al. ............... 365/148 |
| 2008/0025134 | A1 * | 1/2008 | Scheuerlein et al. ... 365/230.06 |
| 2008/0159053 | A1 * | 7/2008 | Yan et al. ............... 365/230.06 |
| 2008/0316795 | A1 * | 12/2008 | Herner et al. ............... 365/148 |
| 2009/0086521 | A1 * | 4/2009 | Herner et al. ................. 365/63 |

OTHER PUBLICATIONS

U.S. Appl. No. 09/560,626, filed Apr. 28, 2000, Knall.

(Continued)

*Primary Examiner*—Anh Phung
*Assistant Examiner*—Toan Le
(74) *Attorney, Agent, or Firm*—Foley & Lardner LLP

(57) ABSTRACT

A method of programming a nonvolatile memory device includes (i) providing a nonvolatile memory cell comprising a diode in series with at least one metal oxide, (ii) applying a first forward bias to change a resistivity state of the metal oxide from a first state to a second state; (iii) applying a second forward bias to change a resistivity state of the metal oxide from a second state to a third state; and (iv) applying a third forward bias to change a resistivity state of the metal oxide from a third state to a fourth state. The fourth resistivity state is higher than the third resistivity state, the third resistivity state is lower than the second resistivity state, and the second resistivity state is lower than the first resistivity state.

20 Claims, 6 Drawing Sheets

OTHER PUBLICATIONS

Baek, et al., "Multi-layer Cross-point Binary Oxide Resistive Memory (OxRRAM) for Post-NAND Storage Application", IEEE, 2005.

Beck, A. et al., "Reproducible Switching Effect in Thin Oxide Films for Memory Applications", Applied Physics Letters, vol. 77, No. 1, 2000, pp. 139-141.

Kim, et al., "Reversible Resistance Switching Behaviors of Pt/NiO/Pt Structures", Japanese Journal of Applied Physics, vol. 46, No. 8A, 2007, pp. 5205-5207.

Kun Ho Ahn, "Change of conduction mechanism by microstructural variation in Pt/(Ba, Sr)TiO$_3$/Pt film capacitors", Journal of Applied Physics, vol. 92, No. 1, 2002, pp. 421-425.

Lee et al., "Resistance Switching of the Nonstoichiometric Zirconium Oxide for Nonvolatile Memory Applications", IEEE Electron Device Letters, vol. 26, No. 9, 2005, pp. 719-721.

Sakamoto, et al., "Electronic transport in Ta$_2$O$_5$", Applied Physics Letters, vol. 91, 092110, 2007.

Sim, et al., "Resistance-Switching Characteristics of Polycrystalline Nb$_2$O$_5$ for Nonvolatile Memory Application", IEEE Electron Device Letters, vol. 26, No. 5, 2005, pp. 292-294.

Watanabe, Y., "Current-Driven Insulator-Conductor Transition and Nonvolatile Memory in Chromium-Doped SrTiO$_3$ Single Crystals", Applied Physics Letters, vol. 78, No. 23, 2001, pp. 3738-3740.

* cited by examiner

US 7,706,169 B2

LARGE CAPACITY ONE-TIME PROGRAMMABLE MEMORY CELL USING METAL OXIDES

BACKGROUND OF THE INVENTION

The invention relates to a nonvolatile memory array.

Nonvolatile memory arrays maintain their data even when power to the device is turned off. In one-time programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

Some solutions for achieving erasable or multi-state cells are complex. Floating gate and SONOS memory cells, for example, operate by storing charge, where the presence, absence or amount of stored charge changes a transistor threshold voltage. These memory cells are three-terminal devices that are relatively difficult to fabricate and operate at the very small dimensions required for competitiveness in modern integrated circuits.

Other memory cells operate by changing the resistivity of relatively exotic materials, like chalcogenides. Chalcogenides are difficult to work with and can present challenges in most semiconductor production facilities.

Thus, a nonvolatile memory array having erasable or multi-state memory cells formed using semiconductor materials in structures that are readily scaled to small size and having a capacity of more than 1 bit/cell (i.e., $\geq 2$ bits/cell) is desirable.

SUMMARY OF THE EMBODIMENTS

On embodiment of the invention provides a method of programming a nonvolatile memory device, comprising (i) providing a nonvolatile memory cell comprising a diode in series with at least one metal oxide, (ii) applying a first forward bias to change a resistivity state of the metal oxide from a first state to a second state; (iii) applying a second forward bias to change a resistivity state of the metal oxide from a second state to a third state; and (iv) applying a third forward bias to change a resistivity state of the metal oxide from a third state to a fourth state. The fourth resistivity state is higher than the third resistivity state, the third resistivity state is lower than the second resistivity state, and the second resistivity state is lower than the first resistivity state.

DETAILED DESCRIPTION OF THE PREFERRED EMBODIMENTS

It has been known that by applying electrical pulses, the resistance of a resistor formed of doped polycrystalline silicon, or polysilicon, can be trimmed, adjusting it between stable resistance states. Such trimmable resistors have been used as elements in integrated circuits.

Figure 1:
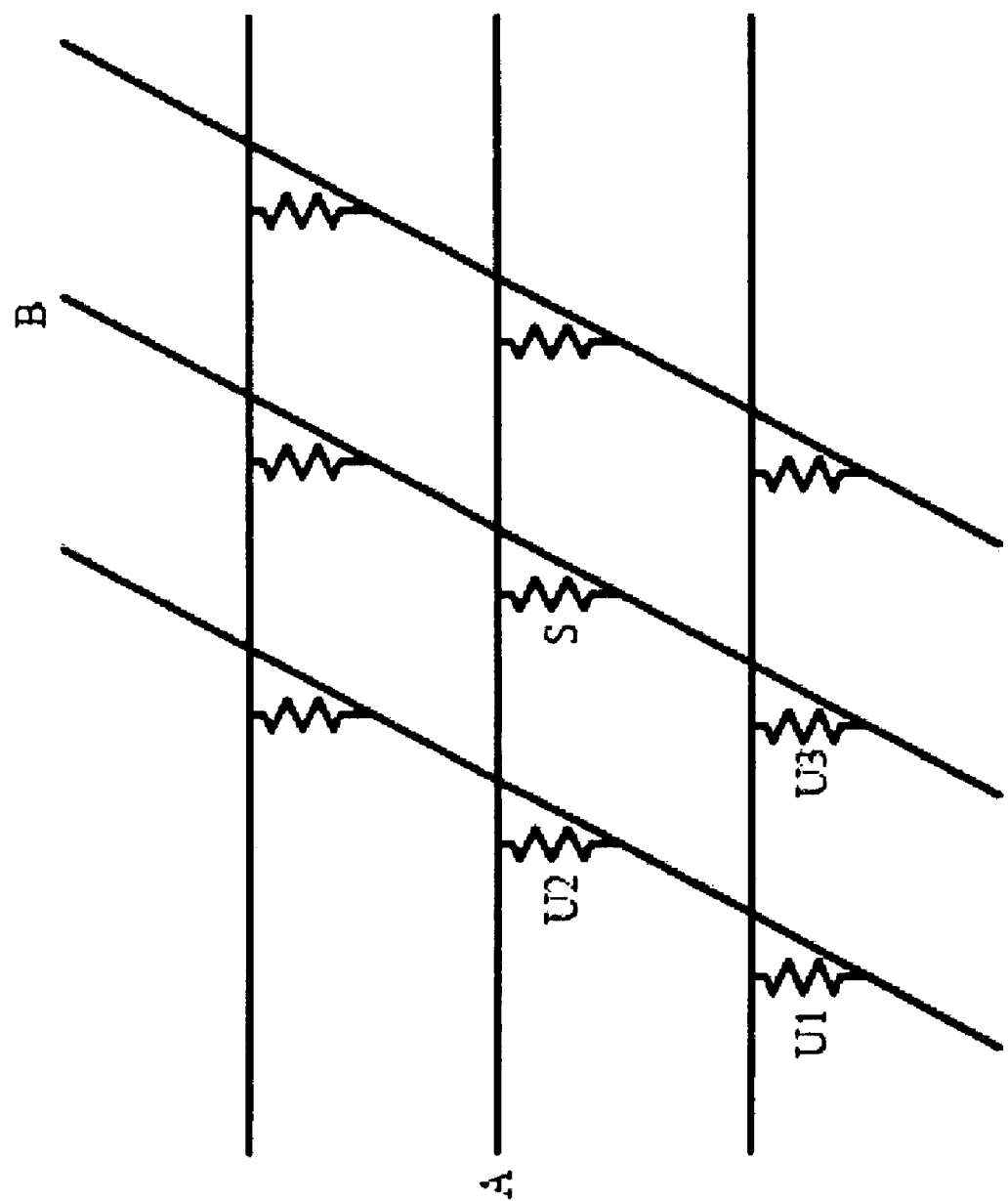
FIG. 1 is a circuit diagram illustrating the need for electrical isolation between memory cells in a memory array.

However, making a memory array of polysilicon resistors presents difficulties. If resistors are used as memory cells in a large cross-point array, when voltage is applied to a selected cell, there will be undesired leakage through half-selected and unselected cells throughout the array. For example, turning to FIG. 1, suppose a voltage is applied between bitline B and wordline A to set, reset, or sense selected cell S. Current is intended to flow through selected cell S. Some leakage current, however, may flow on alternate paths, for example between bitline B and wordline A through unselected cells U1, U2, and U3. Many such alternate paths may exist.

Leakage current can be greatly reduced by forming each memory with a diode. A diode has a non-linear I-V characteristic, allowing very little current flow below a turn-on voltage, and substantially higher current flow above the turn-on voltage. In general a diode also acts as one-way valves passing current more easily in one direction than the other. Thus, so long as biasing schemes are selected that assure that only the selected cell is subjected to a forward current above the turn-on voltage, leakage current along unintended paths (such as the U1-U2-U3 sneak path of FIG. 1) can be greatly reduced.

In this discussion, transition from a higher- to a lower-resistivity state will be called a set transition, affected by a set current, a set or programming voltage, or a set or programming pulse; while the reverse transition, from a lower- to a higher-resistivity state, will be called a reset transition, affected by a reset current, a reset voltage, or a reset pulse which places the diode in an unprogrammed state.

Figure 2:
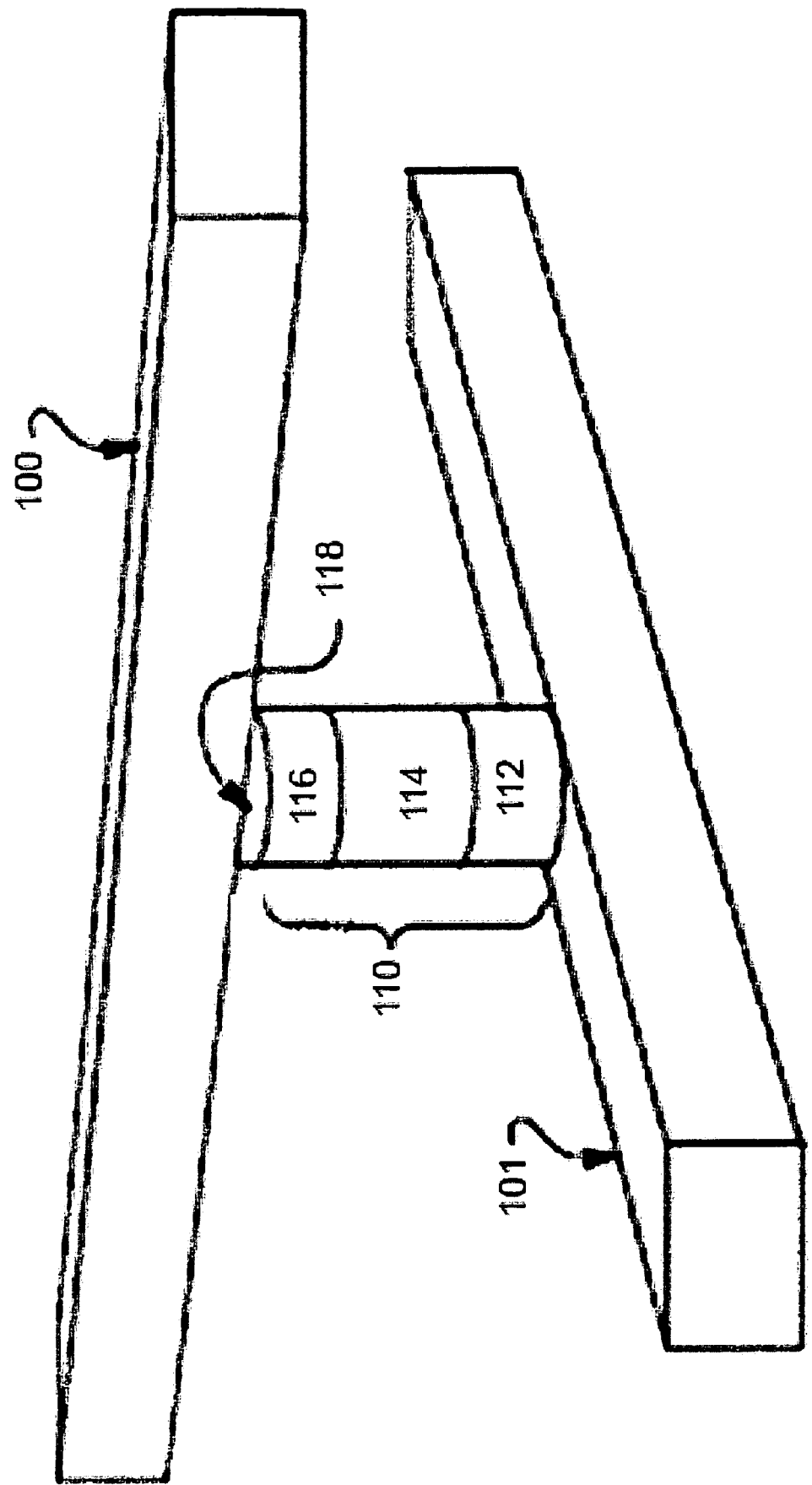
FIG. 2 is a perspective view of a memory cell formed according to a preferred embodiment of the present invention.

In preferred embodiments, the memory cell includes a cylindrical semiconductor diode is located in series with a cylindrical metal oxide layer or film. The diode and the film are disposed between two electrodes, as illustrated in FIG. 2. The number of oxide layers or films need not be limited to one; for example, it can be two or more. The diode and metal oxide film may have a shape other than cylindrical, if desired. For a detailed description of a the design of a memory cell comprising a diode and a metal oxide, see for example U.S. patent application Ser. No. 11/125,939 filed on May 9, 2005 (which corresponds to US Published Application No. 2006/0250836 to Herner et al.), and U.S. patent application Ser. No. 11/395,995 filed on Mar. 31, 2006 (which corresponds to US Patent Published Application No. 2006/0250837 to Herner et al.,) each of which is hereby incorporated by reference. In the preferred embodiments of the invention, the metal oxide film serves as the resistivity switching element and the diode as the steering element of the memory cell.

FIG. 2 illustrates the perspective view of a memory cell formed according to a preferred embodiment of the present invention. A bottom conductor 101 is formed of a conductive material, for example tungsten, and extends in a first direction. Barrier and adhesion layers, such as TiN layers, may be included in bottom conductor 101. The semiconductor diode 110 has a bottom heavily doped n-type region 112; an intrinsic region 114, which is not intentionally doped; and a top heavily doped p-type region 116, though the orientation of this diode may be reversed, as shown in FIGS. 4a to 4d. Such a diode, regardless of its orientation, will be referred to as a p-i-n diode or simply diode. A metal oxide layer 118 is disposed on the diode, either on the p-type region 116 or below the n-region 112 of the diode 110, as shown for example in FIGS. 3(a) and 3(b). Top conductor 100 may be formed in the same manner and of the same materials as bottom conductor 101, and extends in a second direction different from the first direction. The semiconductor diode 110 is vertically disposed between bottom conductor 101 and top conductor 100. The diode can comprise any single crystal, polycrystalline, or amorphous semiconductor material, such as silicon, germanium, or silicon-germanium alloys.

Figure 3A:
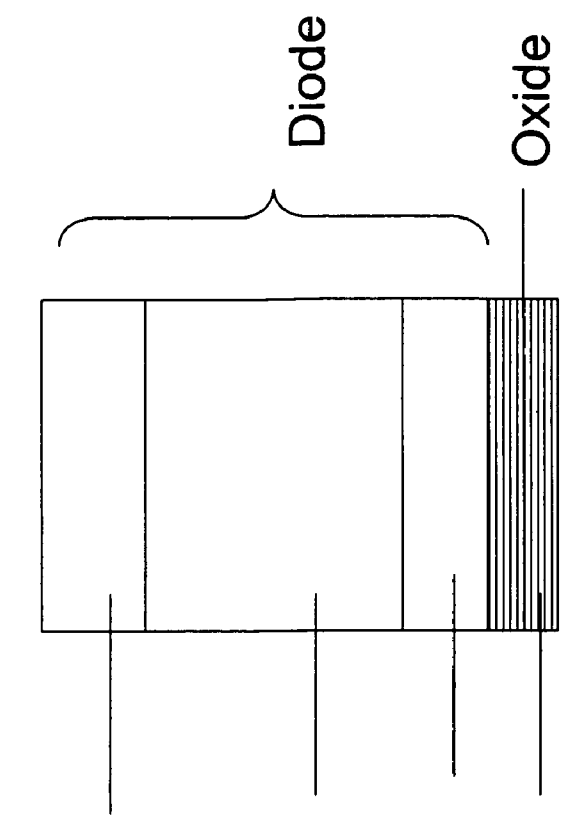
FIGS. 3(a)-3(b) are side cross-sectional views illustrating two embodiments of a memory cell.
Figure 3B:
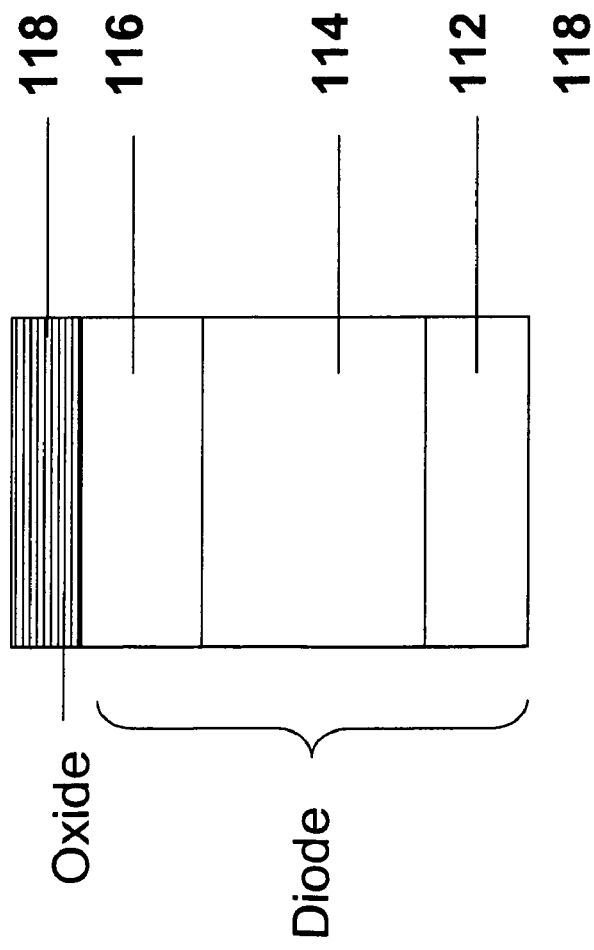
Figure 4A:
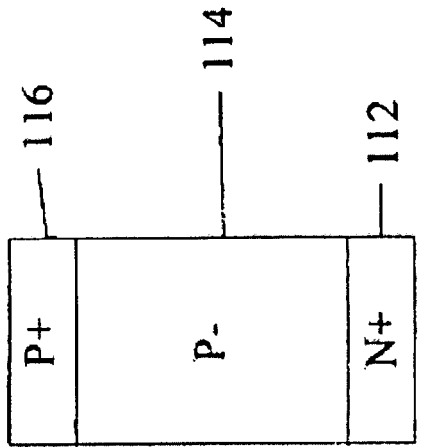
FIGS. 4(a)-4(d) are schematic side cross-sectional views illustrating alternative diode configurations according to an embodiment of the present invention.
Figure 4B:
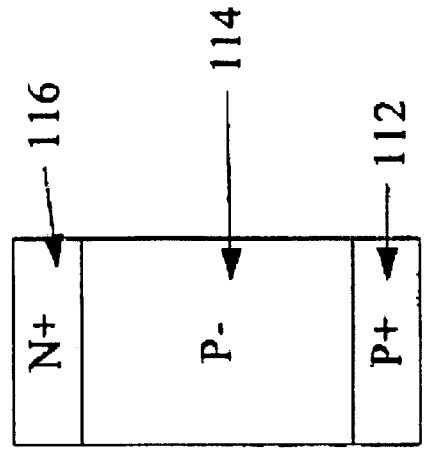
Figure 4C:
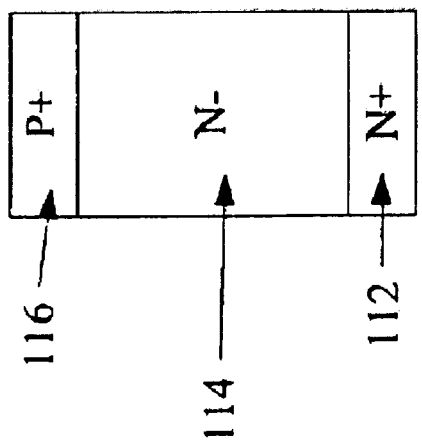
Figure 4D:
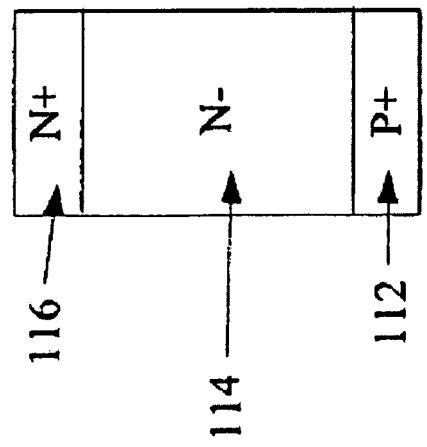

In the preferred embodiments, the diode 110 comprise three different regions 112, 114, 116. In this discussion a region of semiconductor material which is not intentionally doped is described as an intrinsic region 114 as shown in FIG. 2 and FIGS. 3(a)-(b). It will be understood by those skilled in the art, however, that an intrinsic region may in fact include a low concentration of p-type or n-type dopants. Dopants may diffuse into the intrinsic region from the adjacent n or p-doped regions (112 and 116, respectively in FIGS. 3(a) and 3(b)) or may be present in the deposition chamber during deposition due to contamination from an earlier deposition. It will further be understood that deposited intrinsic semiconductor material (such as silicon) may include defects which cause it to behave as if slightly n-doped. Use of the term "intrinsic" to describe silicon, germanium, a silicon-germanium alloy, or some other semiconductor material is not meant to imply that this region contains no dopants whatsoever, nor that such a region is perfectly electrically neutral. The diode need not be limited to a p-i-n design as described; rather, a diode can comprise a combination of the different regions, each with different concentrations of dopants, as illustrated in FIGS. 4(a)-4(d).

Herner et al., U.S. patent application Ser. No. 11/148,530, "Nonvolatile Memory Cell Operating by Increasing Order in Polycrystalline Semiconductor Material," filed Jun. 8, 2006; and Herner, U.S. patent application Ser. No. 10/954,510, "Memory Cell Comprising a Semiconductor Junction Diode Crystallized Adjacent to a Silicide," filed Sep. 29, 2004, both owned by the assignee of the present invention and both hereby incorporated by reference, describe that crystallization of polysilicon adjacent to an appropriate silicide affects the properties of the polysilicon. Certain metal silicides, such as cobalt silicide and titanium silicide, have a lattice structure very close to that of silicon. When amorphous or microcrystalline silicon is crystallized in contact with one of these silicides, the crystal lattice of the silicide provides a template to the silicon during crystallization. The resulting polysilicon will be highly ordered, and relatively low in defects. This high-quality polysilicon, when doped with a conductivity-enhancing dopant, is relatively highly conductive as formed. Such a diode preferably acts as a steering element of the memory cell because the diode does not change resistivity when certain voltage pulses are applied which are sufficient to switch the resistivity state of the metal oxide film.

In contrast, when an amorphous or microcrystalline silicon material is crystallized not in contact with a silicide with which it has a good lattice match, for example when silicon is crystallized in contact only with materials such as silicon dioxide and titanium nitride, with which it has a significant lattice mismatch, the resulting polysilicon will have many more defects, and doped polysilicon crystallized this way will be much less conductive as formed. Such diode can switch resistivity state when bias is applied. In this case, the diode can also serve as a resistivity switching element and as the steering element of the memory cell.

The metal oxide film can be any resistivity switching metal oxide film, such as a pervoskite, such as $CaTiO_3$ or $(Ba,Sr)TiO_3$, or $NiO$, $Nb_2O_5$, $TiO_2$, $HfO_2$, $Al_2O_3$, $MgO$, $CrO_2$, $ZnO_2$, $ZrO_2$, $VO$, or $Ta_2O_5$. The thickness of the metal oxide in the preferred embodiments of the invention can be preferably about 20-1000 Å, more preferably about 40-400 Å, or more preferably about 70-100 Å.

The memory cell initially starts in a high resistivity, low read current state (referred to as the unprogrammed or virgin state). The cell can be put in the programmed, low resistivity state by a high forward bias voltage pulse, preferably at the factory where the cell is made before the product is sold, where power is not a consideration. Once the product is sold, the cell is subsequently put in one or more other states by subsequent forward bias programming pulses. The difference between the read currents of the unprogrammed and programmed states constitutes the "window" for the memory cell. It is desirable for this window to be as large as possible for manufacturing robustness. The present inventors realized that the read current window of the programmed cell and the number of bits per cell can be increased by the following programming method.

The resistivity of the metal oxide can be changed between stable states by applying appropriate electrical pulses. In the preferred embodiments, the set and reset transitions are performed with metal oxide under forward bias. More than one programming pulse can be used. For example, a plurality of forward bias pulses are applied to the cell to switch the metal oxide from a high resistivity, unprogrammed state to a low resistivity, programmed state.

Without wishing to be bound by a particular theory, the conductivity, or inversely the resistivity, of the metal oxide can be modified because the conductivity of the oxide is largely affected by the movements of the oxygen vacancies. For example, a partial depletion of the oxygen vacancies as a result of the vacancies moving out of the oxide film surface can result in an increase of the conductivity, or conversely, a decrease in resistivity. For more detailed descriptions of the characterizations of the metal oxides in nonvolatile memory cell application, see for example Sim et al., *IEEE Electron Device Letters*, 2005, 26, p 292; Lee et al., *IEEE Electron Device Letters*, 2005, 26, p 719; Sakamoto et al., *Applied Physics Letters*, 2007, 91, p 092110-1, which are incorporated by reference to their entirety.

Distinct data states of the memory cell of the embodiments of the present invention thus correspond to resistivity states of the metal oxide in series with the diode. The memory cell can be put into distinct data states by a series of distinct forward biases, preferably ranging from 1 to 20 V, more preferably from 2 to 10 V, and more preferably from 3 to 8 V. Preferably the current flowing through the cell between any one distinct data state and any different distinct data state is different by at least a factor of two, to allow the difference between the states to be readily detectable.

Several examples of preferred embodiments will be provided. It will be understood, however, that these examples are not intended to be limiting. It will be apparent to those skilled in the art that other methods of programming a memory cell device comprising a diode and metal oxide will fall within the scope of the invention.

In a preferred embodiment of the present invention, a diode formed of polycrystalline semiconductor material and at least one metal oxide are arranged in series. The device is used as a one-time programmable multilevel cell, in preferred embodiments having four distinct data states. The term "one-time programmable" means that cell can be non-reversibly programmed into up to four different states.

Figure 5:
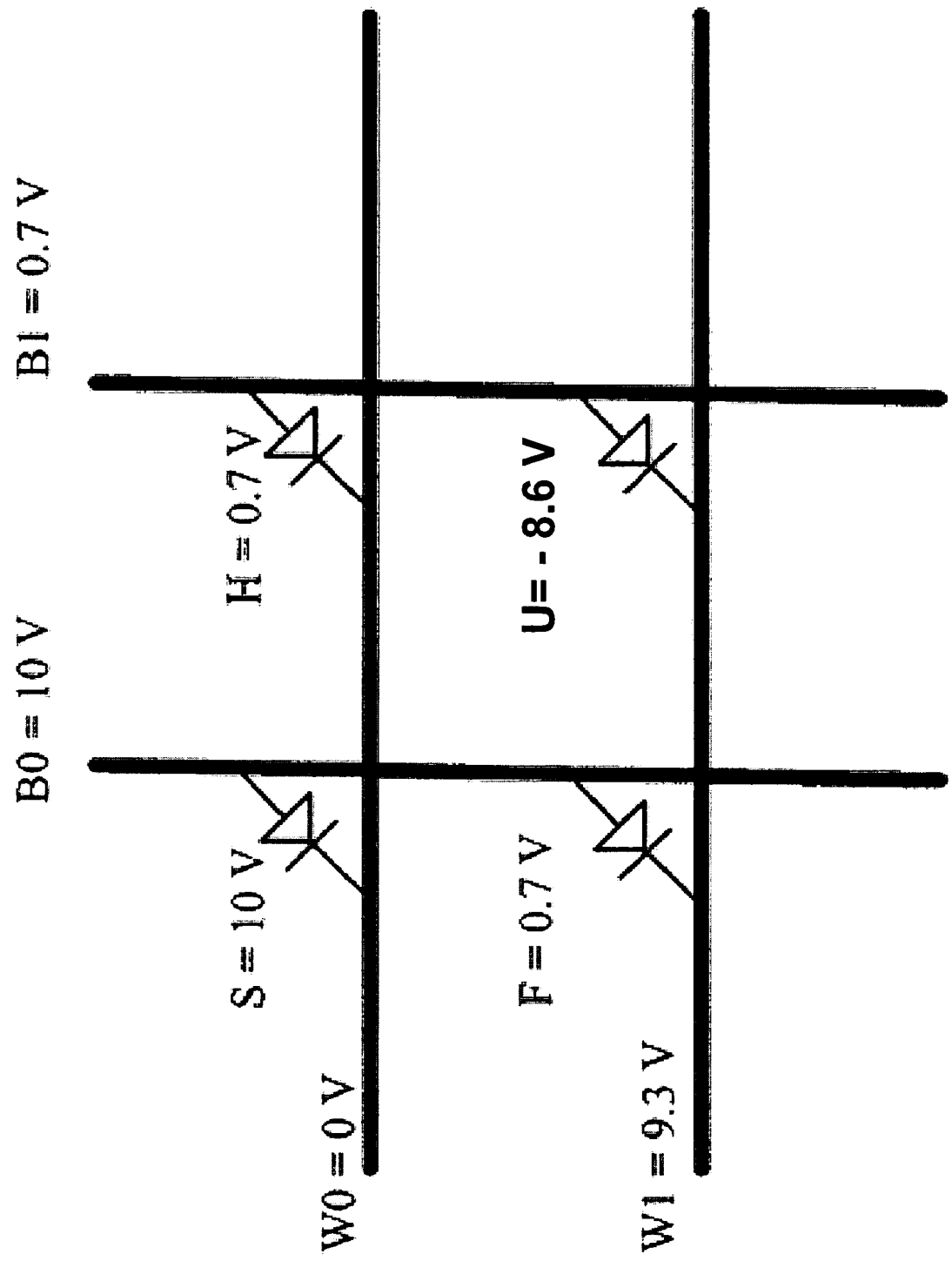
FIG. 5 is a circuit diagram showing a biasing scheme to bias the cell in forward bias.

In the programming method of the embodiments of the invention, a forward bias is applied to the cell having a magnitude greater than a minimum voltage required for programming the cell. FIG. 5 illustrates the application of a forward bias to a portion of a memory cell array. For example, if the minimum voltage required to program the cell is 4 V, then a programming forward bias of 5 or more volts, such as about 8 V to about 12 V, for example 10 V, is applied to the selected cells. The forward bias switches the cell from a relatively high resistivity, unprogrammed state to a relatively low resistivity, programmed state. If desired, the maximum voltage which can be applied without damaging the diode may be used as the programming voltage.

Figure 6:
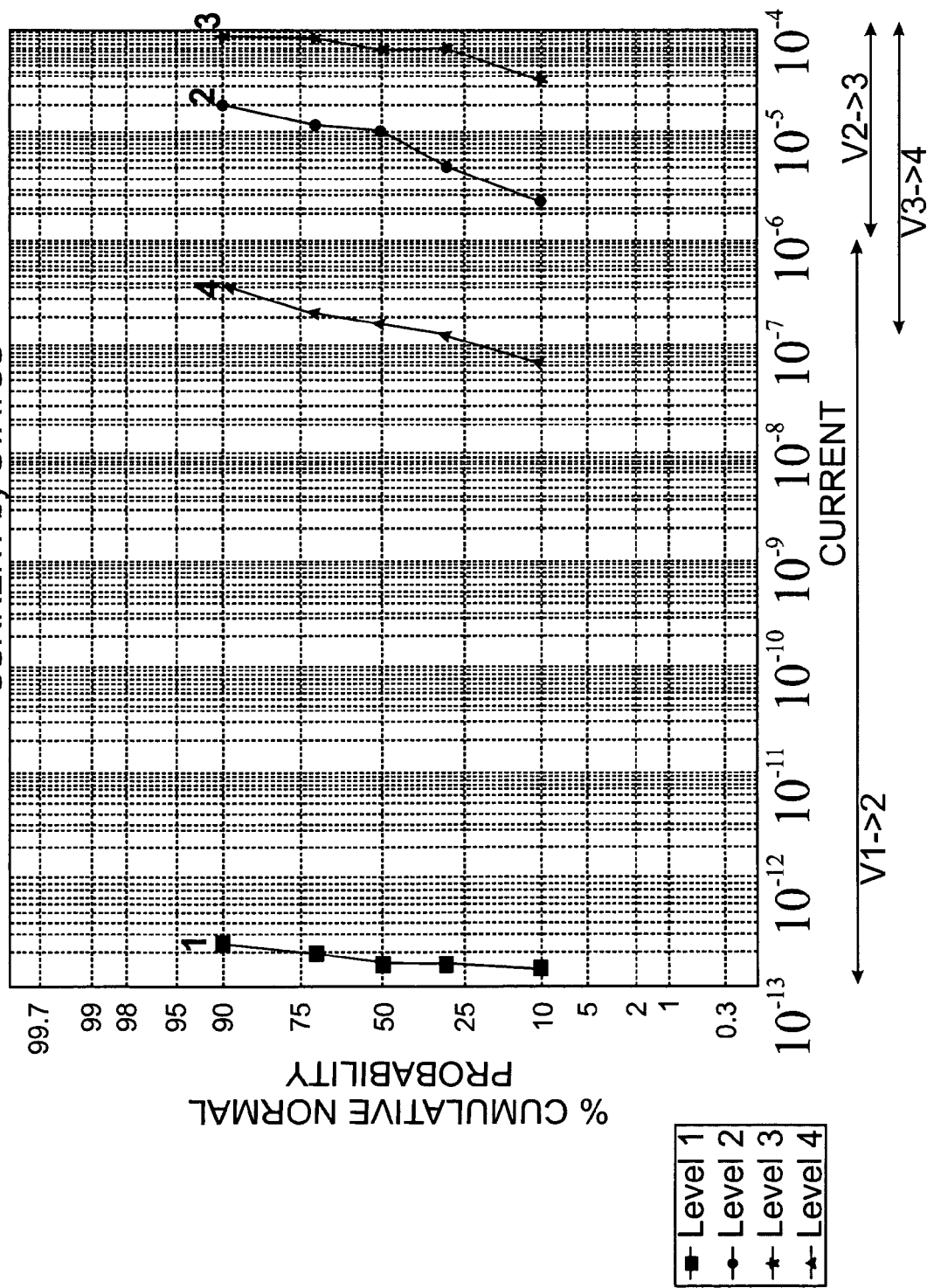
FIG. 6 is a probability plot showing memory cells transformed from the first state 1 to the second state 2, from the second state 2 to the third state 3, and from the third state 3 to the fourth state 4.

FIG. 6 is a probability plot showing read current of a memory cell at 2 V in various states. In one embodiment of the invention, a series of 3 forward biases are applied. A first forward bias current limited voltage ($V_{1\_2}$) (i.e., the programming pulse described above) lowers the resistivity of the metal oxide and changes the resistivity state of the cell from the first state 1 to the second state 2. A second higher current limited forward bias voltage ($V_{2\_3}$) further lowers the resistivity of the oxide and changes the resistivity state of the cell from the second state 2 to the third state 3. Finally, a third even higher current limited forward bias voltage ($V_{3\_4}$) increases the resistivity of the metal oxide and changes the resistivity state of the cell from the third state 3 to the fourth state 4. Thus, state 2 is obtained with a predetermined voltage at a predetermined current limit. Then, state 3 is obtained with a higher voltage and at a higher current limit than state 2. State 4 is obtained with a lower voltage than state 3, but at a higher current limit than state 3 (i.e., the current limit to obtain state 4 is the highest current limit of the four states). The successive current limits for the different states ensure that state 2 is obtained without moving directly to state 3 or 4 without going through state 2 by the application of the forward bias voltages. The four resistivity states of the oxide are distinguishable from the states of the diode, which in the preferred embodiments is used as a steering element and has minimal effects on change of cell resistivity.

The initial read current is between about $1 \times 10^{-13}$ and $2 \times 10^{-13}$ A when a first electrical forward bias pulse, $V_{1\_2}$, is applied. The pulse has a magnitude greater than a minimum voltage required for programming the cell. The voltage applied can be about 10 V. The pulse width can be between about 100 and about 500 nsec. This first electrical pulse switches the metal oxide from a first resistivity state 1 to a second resistivity state 2, with the second state having lower resistivity than the first state; this transition is labeled "1→2" in FIG. 6. The resultant read current in the F state is between about $2 \times 10^{-6}$ and $11 \times 10^{-6}$ A. A second forward bias pulse $V_{2\_3}$ is then applied, with $V_{2\_3}$ being larger than $V_{1\_2}$, further lowering the resistivity of the oxide. The resulting read current of the cell is between about $2 \times 10^{-5}$ and $10 \times 10^{-5}$ A. Finally, a third forward bias pulse $V_{3\_4}$ is applied, with $V_{3\_4}$ being smaller than $V_{2\_3}$, increasing the resistivity of the oxide. The resulting read current is between about $0.7 \times 10^{-7}$ and $4 \times 10^{-7}$ A.

Generally, a device for programming the memory cells is a driver circuit located under, over, or adjacent to the memory cell. The circuit can have a monolithic integrated structure, or a plurality of integrated device packaged together or in close proximity or die-bonded together. For a detailed descriptions of the driver circuit, see for example, U.S. patent application Ser. No. 10/185,508 by Cleeves; U.S. patent application Ser. No. 09/560,626 by Knall; and U.S. Pat. No. 6,055,180 to Gudensen et al., each of which is hereby incorporated by reference.

The memory cell is preferably a one-time programmable cell, but it can also be used as a rewriteable memory cell, and may have two, three, four, or more distinct data states. In the preferred embodiments, the resistivity of the metal oxide is higher than that of the diode. As a result, the memory cell with the metal oxide serving as the resistivity switching element and the diode as the steering element can have memory capacity of at least 2 bits/cell.

The memory cell may be fabricated by any suitable methods. For example, the methods described U.S. patent application Ser. No. 11/125,939 filed on May 9, 2005 (which corresponds to US Published Application No. 2006/0250836 to Herner et al.), and U.S. patent application Ser. No. 11/395,995 filed on Mar. 31, 2006 (which corresponds to US Patent Published Application No. 2006/0250837 to Herner et al.,) which are incorporated by reference in their entirety may be used.

The above described memory cell shown in FIG. 2 may be located in a one memory level device. If desired, additional memory levels can be formed above the first memory level to form a monolithic three dimensional memory array. In some embodiments, conductors can be shared between memory levels; i.e. top conductor 100 shown in FIG. 2 would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of programming a nonvolatile memory cell, comprising:
   providing a nonvolatile memory cell comprising a diode in series with at least one metal oxide;
   applying a first forward bias to change a resistivity state of the metal oxide from a first state to a second state;
   applying a second forward bias to change a resistivity state of the metal oxide from a second state to a third state; and applying a third forward bias to change a resistivity state of the metal oxide from a third state to a fourth state;

wherein the fourth resistivity state is higher than the third resistivity state, the third resistivity state is lower than the second resistivity state, and the second resistivity state is lower than the first resistivity state.

2. The method according to claim 1, wherein the diode comprises a steering element and the metal oxide comprises a resistivity switching element.

3. The method according to claim 1, wherein the memory cell is a one-time programmable cell and the diode comprises p-i-n polysilicon diode.

4. The method according to claim 1, wherein the metal oxide comprises a pervoskite, NiO, $Nb_2O_5$, $TiO_2$, $HfO_2$, $Al_2O_3$, MgO, $CrO_2$, $ZnO_2$, $ZrO_2$, VO, or $Ta_2O_5$.

5. The method according to claim 4, wherein the metal oxide is a pervoskite comprising $CaTiO_3$ or $(Ba,Sr)TiO_3$.

6. The method according to claim 1, wherein the metal oxide has a higher resistivity than the diode.

7. The method according to claim 1, wherein the metal oxide has a thickness about 20 to about 1000 Å.

8. The method according to claim 1, wherein the metal oxide has a thickness about 40-400 Å.

9. The method according to claim 1, wherein memory cell comprises a portion of a monolithic three dimensional array of nonvolatile memory cells.

10. The method according to claim 1, wherein the first forward bias is smaller than the second forward bias.

11. The method according to claim 1, wherein the second forward bias is larger than the third forward bias.

12. The method according to claim 1, wherein:
the second forward bias is larger than the first or the third forward bias;
the second forward bias is applied at a higher current limit than the first forward bias; and
the third forward bias is applied at higher current limit than the second forward bias.

13. The method according to claim 1, wherein the fourth resistivity state is intermediate between the first and the second resistivity states.

14. The method according to claim 1, wherein the first, second and third forward biases range from 1 to 20 V.

15. The method according to claim 1, wherein the first, second and third forward biases range from 2 to 10 V.

16. The method according to claim 1, wherein the first, second and third forward biases range from 3 to 8 V.

17. A device, comprising:
at least one nonvolatile memory cell comprising a diode steering element located in series with a metal oxide resistivity switching element; and
a means for programming the at least one nonvolatile memory cell by applying a first forward bias to change a resistivity state of the metal oxide from a first state to a second state, applying a second forward bias to change a resistivity state of the metal oxide from a second state to a third state, and applying a third forward bias to change a resistivity state of the metal oxide from a third state to a fourth state, wherein the fourth resistivity state is higher than the third resistivity state, the third resistivity state is lower than the second resistivity state, and the second resistivity state is lower than the first resistivity state.

18. The device according to claim 17, wherein:
the metal oxide has a higher resistivity than the diode; and
the means for programming comprises a driver circuit.

19. The device according to claim 17, wherein the device comprises a monolithic three dimensional array of nonvolatile memory cells.

20. The device according to claim 17, wherein:
the memory cell is a one-time programmable cell;
the diode comprises p-i-n polysilicon diode; and
the metal oxide comprises a pervoskite, NiO, $Nb_2O_5$, $TiO_2$, $HfO_2$, $Al_2O_3$, MgO, $CrO_2$, $ZnO_2$, $ZrO_2$, VO, or $Ta_2O_5$.

* * * * *